(12) United States Patent
Vranken et al.

(10) Patent No.: US 7,376,873 B2
(45) Date of Patent: May 20, 2008

(54) METHOD AND SYSTEM FOR SELECTIVELY MASKING TEST RESPONSES

(75) Inventors: Hendrikus Petrus Elisabeth Vranken, Eindhoven (NL); Andreas Glowatz, Heidenau (DE); Friedrich Hapke, Winsen/Luhe (DE)

(73) Assignee: NXP B.V., Eindhoven (NL)

( * ) Notice: Subject to any disclaimer, the term of this patent is extended or adjusted under 35 U.S.C. 154(b) by 151 days.

(21) Appl. No.: 10/573,083

(22) PCT Filed: Sep. 20, 2004

(86) PCT No.: PCT/IB2004/051799

§ 371 (c)(1),
(2), (4) Date: Mar. 23, 2006

(87) PCT Pub. No.: WO2005/031378

PCT Pub. Date: Apr. 7, 2005

(65) Prior Publication Data

US 2007/0067688 A1  Mar. 22, 2007

(30) Foreign Application Priority Data

Sep. 26, 2003 (EP) ................................. 03103575
May 18, 2004 (EP) ................................. 04102184

(51) Int. Cl.
*G01R 31/28* (2006.01)
(52) U.S. Cl. .......................... 714/724; 714/30
(58) Field of Classification Search ............... 714/719, 714/724, 729, 732, 30; 375/340
See application file for complete search history.

(56) References Cited

U.S. PATENT DOCUMENTS

| 6,311,299 | B1 * | 10/2001 | Bunker | 714/719 |
| 6,829,740 | B2 * | 12/2004 | Rajski et al. | 714/729 |
| 7,032,148 | B2 * | 4/2006 | Wang et al. | 714/729 |
| 7,095,808 | B1 * | 8/2006 | Shohara | 375/340 |
| 7,210,083 | B2 * | 4/2007 | Grinchuk et al. | 714/732 |

* cited by examiner

Primary Examiner—David Ton
(74) Attorney, Agent, or Firm—Peter Zawilski

(57) ABSTRACT

An apparatus for testing an integrated circuit is disclosed. The apparatus includes a compactor to compress test responses from a circuit under test that is part of an integrated circuit.

9 Claims, 2 Drawing Sheets

METHOD AND SYSTEM FOR SELECTIVELY MASKING TEST RESPONSES

The present invention relates to an apparatus for testing an integrated circuit (IC) comprising: a compactor to compress test responses from a circuit under test that is part of an IC; and masking circuitry coupled between the circuit under test and the compactor for masking one or more of the test responses from the circuit under test.

The present invention also relates to a method for testing of an IC.

The present invention further relates to a method for computing compressed mask data for use in masking test data from an IC.

It is beneficial to compact test responses from an IC since this allows for reducing the test data volume and test time. However, the values of some test responses cannot be determined a priori, while other test responses may be tri-stated or unreliable. These unknown, tri-stated, and unreliable test responses, referred to as 'X' test responses, cause that reliable compaction of test responses becomes very difficult or even impossible.

Manufacturing tests for digital ICs are typically performed using Automated Test Equipment (ATE), also referred to as an IC tester. An ATE stores test stimuli and applies these stimuli to the IC. The subsequent responses of the IC are then observed by the ATE. The ATE compares these observed responses with the expected responses of a fault-free IC. This allows to determine whether the IC passed or failed the test, and to diagnose faults. The ATE stores the test stimuli and the fault-free test responses in its memory.

Digital ICs usually contain scan chains. This implies that the flip-flops in the IC can be configured into serial shift registers, i.e. scan chains, in test mode. A test is performed by repeatedly: (1) shifting a test stimulus into the scan chains of the IC in test mode; (2) operating the IC for a number of clock cycles in its functional application mode; and (3) shifting out the test responses in test mode. When shifting out the test responses, new test stimulus are usually shifted in.

Continuous improvements in IC process technology allow for an exponential increase of the numbers of transistors on an IC, according to Moore's law. Consequently, the test data volumes are also increasing exponentially. New IC process technologies introduce new defect types and additional tests are needed to detect these defects, which causes an even larger increase of test data volumes. This sharp increase in test data volumes causes critical problems related to ATE usage and test costs. The test data volumes may exceed the capacity of ATE memories and the time required for carrying out testing is increasing.

Solutions are provided by test data compression techniques and Built-In Self-Test (BIST) techniques. These techniques compact the test responses in space and/or time by using special test response compaction circuitry such as, for example, a Multiple-Input Signature Register (MISR) or Space-Compaction Logic (SCL). This compaction circuitry may reside either on-chip, off-chip, e.g. on the load-board for example, or in the ATE. The compaction circuitry outputs compacted test responses, which are observed by the ATE and compared with the expected, compacted responses of a fault-free circuit. Hence, the ATE now only has to store the compacted test responses, which reduces memory requirements.

A problem associated with the state-of-the-art is that some test responses have to be discarded, or masked, before the test responses can be compacted. This is the case for tri-stated (Z), unknown (U), and unreliable test responses, i.e. 'X' responses.

Tri-stated test responses have a high impedance state (Z) and may originate for instance from bi-directional input/output pins.

Unknown test responses have an unknown value (U), and may originate for instance from uninitialized embedded memories, mixed-signal modules and/or conflicting or floating buses. Also, when shifting in the first test stimulus into an IC, unknown values are shifted out of the IC. An unknown test response implies a test response that is either logic low (L), i.e. 0, logic high (H), i.e. 1, or tri-stated (Z), but its value cannot be determined before the test is performed.

Unreliable test responses have an unreliable result that might be incorrect. This may occur for instance in circuits with multiple clock domains, where unreliable test responses are generated due to clock skew when testing the signal lines that cross clock-domain boundaries.

Compacting test responses that contain 'X' responses will lead to unreliable compacted test responses that cannot be used to determine whether the circuitry within the IC passed or failed the test, or for the diagnosis of faults. Hence, test response compaction cannot be applied to circuitry that produces 'X' responses.

Tri-stated, unknown, and unreliable values in test responses should either be discarded, i.e. masked, or prevented from occurring.

A partial state-of-the-art solution is to resolve unknown test responses inside the circuit by adding appropriate Design-for-Testability (DfT) hardware. For instance, test points may be inserted in signal lines that carry unknown values, which forces the signal lines to a known, fixed value. Adding DfT to the circuit for preventing unknown values however requires, often manual, modification of the circuit. This may be impossible in instances of 'hard cores' for which only the circuit layout is available or undesirable in instances where the DfT hardware affects timing such that the circuitry under test cannot run at the required frequency.

A more preferable solution requires one to mask all tri-stated, unknown, and unreliable test responses at the output of the IC, before they enter the compaction circuit. This can be achieved with X-Masking Logic (God). The XML masks out all 'X' responses, where 'X' indicates either a tri-stated (Z), an unknown (U), or an unreliable test response. Masking implies that the 'X' response is replaced by a known, fixed, value, for example a logic high (H). When implementing the XML on-chip, the additional silicon area for the XML should ideally be small. Furthermore, the XML should be flexible, such that it can be accommodated in case different test responses are obtained, for instance due to different test patterns or due to design changes. The operation of the XML may be controlled from the ATE. In such a case, the amount of data stored on the ATE for controlling the XML should also ideally be small. Furthermore, the bandwidth requirements for transporting this data from the ATE to the IC should again, ideally, be small. Disadvantageously, various XML implementations have been proposed in the state-of-the-art, but these XML implementations do not completely meet the aforementioned requirements.

An object of the invention is to reduce the amount of test data.

In a first aspect of the present invention, the object is achieved in that the masking circuitry further comprises decompression circuitry for receiving compressed mask data and providing decompressed mask data.

In an advantageous embodiment of the present invention, the decompression circuitry further comprises a linear-feedback shift register.

In another advantageous embodiment of the present invention, the decompression circuitry further comprises a phase shifter.

In yet another advantageous embodiment of the present invention, the decompression circuitry further comprises weighting logic.

In a further advantageous embodiment of the present invention, the compressed mask data comprises at least one control signal.

In a still further advantageous embodiment of the present invention, the at least one control signal is a mask all control signal.

In yet another further advantageous embodiment of the present invention, the at least one control signal is a mask enable control signal.

In a second aspect of the present invention, the object is achieved in that: compressed mask data is provided to decompression circuitry; the compressed mask data is decompressed so as to produce decompressed mask data; and test responses from the integrated circuit are masked in response to the decompressed mask data In a third aspect of the present invention, the object is achieved in that: a set of equations associated with the mask data are generated; and the equations are solved so as to obtain compressed mask data.

For a better understanding of the apparatus of the present invention, and to show more clearly how it may be carried into effect, reference will now be made, by way of example, to the accompanying exemplary drawings, in which.

Figure 1:
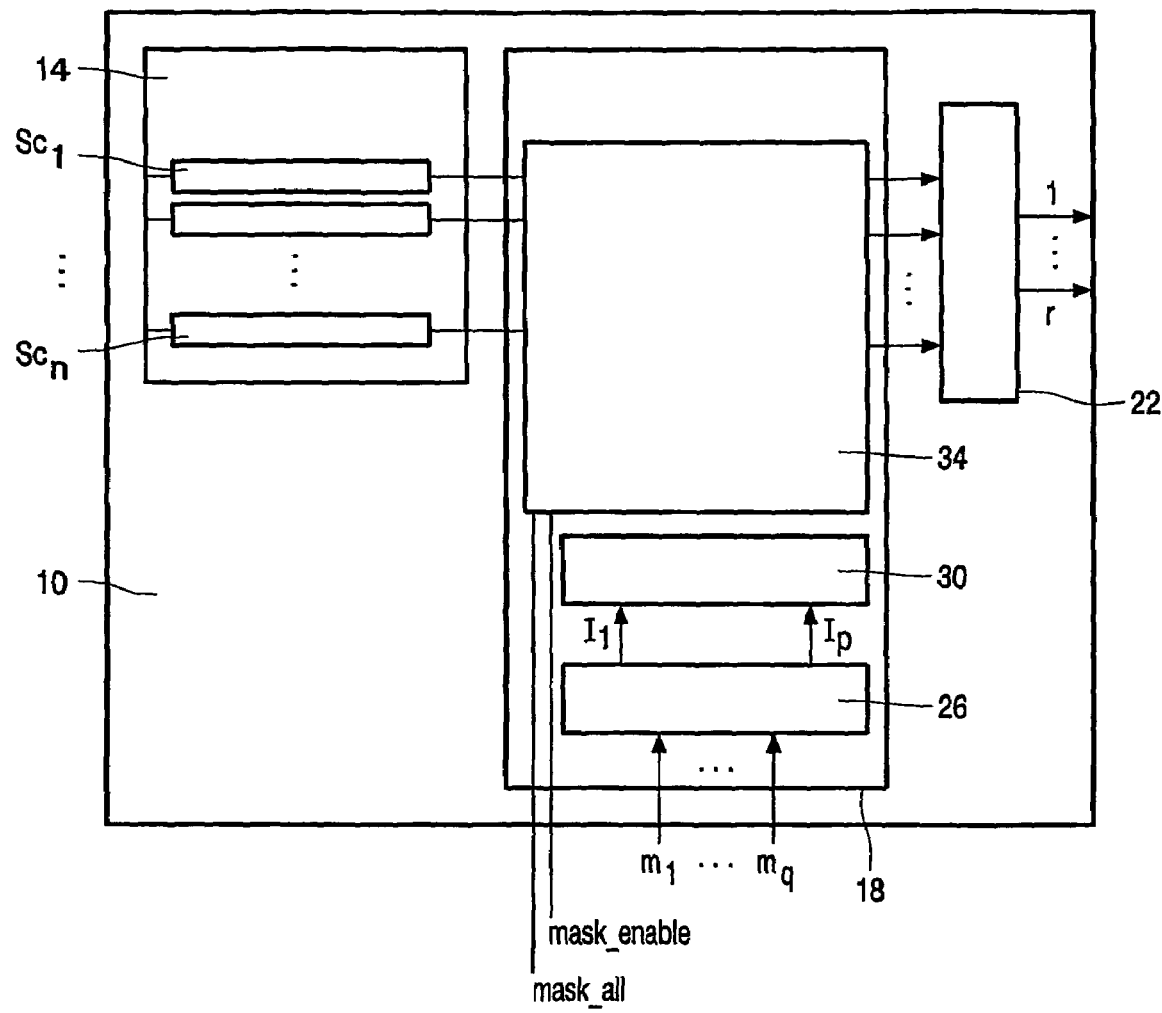
FIG. 1 illustrates an example of X-Masking Logic (XML) according to the present invention.

FIG. 1 illustrates an example of X-Masking Logic (XML) according to the present invention FIG. 1 comprises an IC 10 that itself comprises a circuit-under-test 14, the XML 18, and a compactor 22. The circuit-under-test 14 comprises n scan chains SC1-SCn whose outputs are connected, via the XML 18, to the compactor 22 for compacting test responses from the circuit-under-test 14. The compactor 22 may, for example, be implemented by a Multiple-Input Signature Register (MISR) or Space Compaction Logic (SCL), such implementations being known in the art. Although FIG. 1 illustrates the XML 18 and compactor 22 as being incorporated as part of the IC 10, the XML 18 and/or the compactor 22 may also be placed off-chip such as, for example, on an Automatic Test Equipment (ATE) load-board or indeed within an ATE (not illustrated) itself.

The XML 18 comprises a Linear-Feedback Shift Register (LFSR) 26, a phase shifter with weighting logic 30, and control logic 34. The XML 18 is controlled from the ATE using control signals mask_all and mask_all and mask$_{13}$ enable. The ATE updates the logic states of the XML 18 every clock cycle through input terminals that provide the signals $m_1$-$m_q$, i.e. the compressed mask data.

The XML 18, according to the present invention, allows the amount of masking data that has to be stored on the ATE to be reduced. Accordingly, the ATE has to store q+2 bits per clock cycle that represents the mask_all, mask_enable, and $m_1$-$m_q$ signals. These q+2 input bits are decompressed by the XML 18 into a mask of n output bits, where q<<n. Hence, without XML 18 according to the present invention, the ATE would normally have to: store an n-bit mask for each clock cycle; and n IC input pins would be required in order to transfer such a mask from the ATE to the IC 10. When using the XML 18, according to the present invention, the ATE has the advantage that it only has to: store q+2 bits of XML 18 data, which represents the control and mask data signals mask_all, mask_enable and $m_1$-$m_q$, for each clock cycle; and only q+2 IC input pins are required to transfer this data from the ATE to the IC 10.

Figure 2:
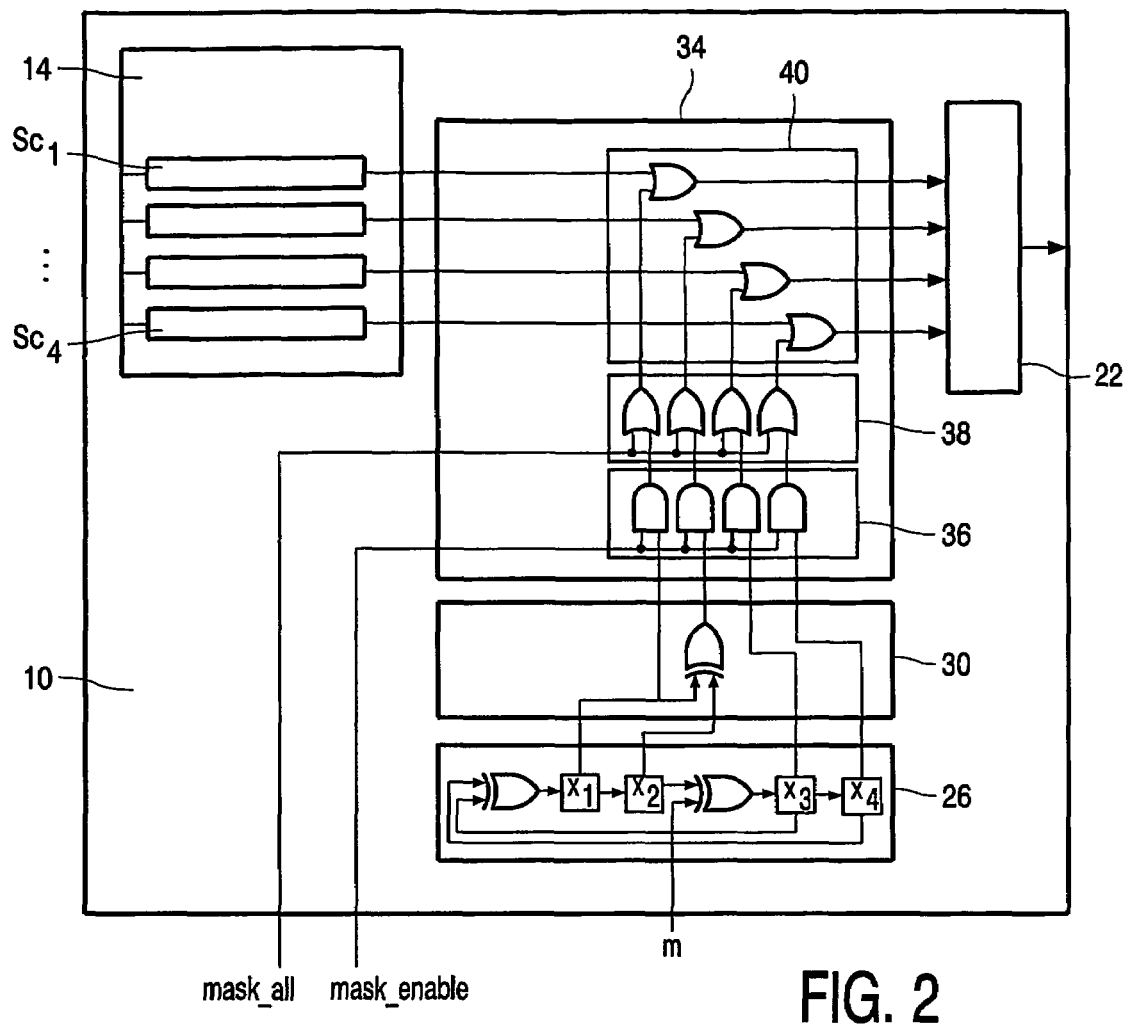
FIG. 2 illustrates a more detailed example of X-Masking Logic (XML) according to the present invention.

FIG. 2 illustrates a more detailed example of X-Masking Logic (XML) according to the present invention.

The exemplary XML 18 of FIG. 2 illustrates: a circuit-under-test 14 that comprises four scan chains SC1-SC4; a 4-bit LFSR 26; a phase shifter 30; and control logic 34 that comprises three stages.

The LFSR 26 illustrated in this FIG. 2 is a well-known structure that comprises a shift register and a feedback network of XOR gates. The LFSR 26, which receives the compressed mask data from the ATE, is p-bits wide, that is to say its shift register contains p flip-flops: in this particular example p=4. During each clock cycle, the state of the LFSR 26 is partially updated using q mask data bits from the ATE, where $q \leq p$, through inputs $m_1$, -$m_q$: in this particular example q=1. This updating can be implemented, for example, by adding XOR gates to the shift register, where the input of each of i XOR gates is connected to receive a respective input signal $m_i$: where $1 \leq i \leq q$. The LFSR 26 performs a partial decompression operation to decompress the compressed mask data from the ATE. The, partially decompressed, output data from the LFSR 26 is used as input data to the phase shifter 30.

The phase shifter 30 illustrated in this FIG. 2 is also a well-known structure that comprises a network of XOR gates. The phase shifter 30 performs a further decompression operation on the data from the LFSR 26 and generates n outputs signals from p input signals, where $p \leq n$: in this particular example n=4. The phase shifter 30 is constructed such that the output signals of the phase shifter are uncorrelated, i.e. each output signal depends on a different set of input signals. It should be noted that weighting logic (not illustrated) may be added to the phase shifter 30, wherein this weighting logic allows for the biasing of the probability that a certain output signal is a logic 0 or a logic 1. The weighting logic typically comprises some combinational logic that may optionally be controlled using additional input signals from the ATE.

The n (where, in this particular example, n=4) output signals of the phase shifter 30 are used as input signals to the control logic 34.

The first stage 36 of the control logic 34 comprises four AND gates that are controlled by the mask_enable control signal and further decompresses the data from the phase shifter 30. When mask_enable is a logic 1, the respective outputs of the AND gates are equal to, i.e. mirror, their respective associated outputs from the phase shifter 30. When mask_enable is a logic 0 the outputs of all AND gates are forced to a logic 0 and therefore, the n-bit output mask from the phase shifter 30 becomes an output mask that comprises all logic 0's. The second stage 38 of the control logic 34 comprises four OR gates that are controlled by the mask_all control signal and further decompresses the data from the first stage 36. When mask_all is a logic 0, the respective outputs of the OR gates are equal to, i.e. mirror, their respective associated outputs from the first stage 36 of the control logic 34. When mask_all is a logic 1, the outputs of all OR gates are forced to a logic 1 and therefore, the n-bit mask from the outputs of the second stage 38 of control logic is replaced by an n-bit mask that comprises all logic 1's.

The third stage 40 of the control logic 34 comprises four OR gates that are operatively arranged to receive output signals from the scan chains SC1-SC4 and the second stage 38 output signals. This third stage 40 of OR gates modifies the IC test responses from the scan chains SC1-SC4 with the n-bit mask from the second stage 38 control logic.

The third stage 40 of the control logic 34 is always required, since this stage 40 implements the actual masking.

This third stage 40 acts as mask circuitry that operatively receives the n-bit mask from the second stage 38 together with the corresponding n outputs, via the n scan chains SC1-SCn, from the circuit-under-test 14. In a first example where an output signal from the second stage 38 is a logic 1 and is applied to an OR gate in the third stage 40, then the corresponding test response from the corresponding scan chain is replaced by a logic 1, and the test response is said to be masked. In a second example where an output signal from the second stage 38 is a logic 0, then the corresponding test response passes through the OR gate and is therefore not masked. Hence, a value of logic 1 in a mask indicates that the test response of the corresponding scan chain is masked, and conversely, a logic 0 in a mask indicates that the test response of the corresponding scan chain is not masked. An alternative embodiment (not illustrated) of the third stage 40 of FIG. 2 would be to replace the OR gates with AND gates. In such an AND gate implementation of the third stage 40, a logic 0 value in a mask indicates that the test response of the corresponding scan chain is masked, and conversely, a logic 1 value indicates that the test response is not masked. In that case, the third stage should contain AND gates instead of OR gates. Hence, it should be clear that the illustrated control logic is only an exemplary embodiment and alternative implementations using different types of logic gates are also possible.

The first stage 36 and/or the second stage 38 of the control logic 34 are optional as is the phase shifter 30, including its associated weighting logic.

The control logic 34 may also be adapted. For example, the mask_all control signal may be refined such that it is split into two such independent control signals. These two mask_all control signals may then be used such that they each control a portion of the masking of the data outputs from the scan chains SC1-SCn. Similarly, the mask_enable control signal may also be refined so that it to is, for example, split into two independent control signals: the two mask_enable control signals may then be used such that they each control a portion of the enable/disable masking of the data outputs from the scan chains SC1-SCn.

The operation of the XML 18 will now be described in more detail in the following example.

The example in FIG. 2 illustrates an XML 18 for a circuit-under-test 14 that comprises four scan chains SC1-SC4. The XML 18 includes a 4-bit LFSR 26, a phase shifter 30, and a three-stage control logic.

The symbols $x_1$, $x_2$, $x_3$, and $x_4$ represent the initial values, i.e. logic states, of the LFSR 26 at clock cycle 1. The state of the LFSR 26 in subsequent clock cycles can be expressed in terms of the logic states of the LFSR 26 in addition to the state of the input signal m from the ATE. These expressions can easily be derived by means of symbolic simulation. The LFSR 26 logic states in the next five clock cycles are as follows, where $LFSR_1$ indicates the LFSR 26 state in clock cycle i, and $m_i$ indicates the value of signal m in clock cycle i.

$LFSR_1 = (x_1, x_2, x_3, x_4)$
$LFSR_2 = (x_3 \oplus x_4, x_1, x_2 \oplus m_1, x_3)$
$LFSR_3 = (x_2 \oplus x_3 \oplus m_1, x_3 \oplus x_4, x_1 \oplus m_2, x_2 \oplus m_1)$
$LFSR_4 = (x_1 \oplus x_2 \oplus m_1 \oplus m_2, x_2 \oplus x_3 \oplus m_1, x_3 \oplus x_4 \oplus m_3, x_1 \oplus m_2)$
$LFSR_5 = (x_1 \oplus x_3 \oplus x_4 \oplus m_2 \oplus m_3, x_1 \oplus x_2 \oplus m_1 \oplus m_2, x_2 \oplus x_3 \oplus m_1 \oplus m_4, x_3 \oplus x_4 \oplus m_3)$
$LFSR_6 = (x_2 \oplus x_4 \oplus m_1 \oplus m_3 \oplus m_2 m_4, x_1 \oplus x_3 \oplus x_4 \oplus m_3, x_1 \oplus x_2 \oplus m_1 \oplus m_2 \oplus m_5, x_2 \oplus x_3 \oplus m_1 \oplus m_4)$ In a similar way, the output signals of the phase shifter 30 can also be expressed in terms of the symbols $x_1$, $x_2$, $x_3$, $x_4$, and $m_i$.

$PS_1 = (x_1, x_1 \oplus x_2, x_3, x_4)$
$PS_2 = (x_3 \oplus x_4, x_1 \oplus x_3 \oplus x_4, x_2 \oplus m_1, x_3)$
$PS_3 = (x_2 \oplus x_3 \oplus m_1, x_2 \oplus x_4 \oplus m_1, x_1 \oplus m_2, x_2 \oplus m_1)$
$PS_4 = (x_1 \oplus x_2 \oplus m_1 \oplus m_2, x_1 \oplus x_3 \oplus m_2, x_3 \oplus x_4 \oplus m_3, x_1 \oplus m_2)$
$PS_5 = (x_1 \oplus x_3 \oplus x_4 \oplus m_2 \oplus m_3, x_2 \oplus x_3 \oplus x_4 \oplus m_1 \oplus m_3, x_2 \oplus x_3 \oplus m_1 \oplus m_4, x_3 \oplus x_4 \oplus m_3)$
$PS_6 = (x_2 \oplus x_4 \oplus m_1 \oplus m_3 \oplus m_4, x_1 \oplus x_2 \oplus x_3 \oplus m_1 \oplus m_2 \oplus m_4, x_1 \oplus x_2 \oplus m_1 \oplus m_2 \oplus m_5, x_2 \oplus x_3 \oplus m_1 \oplus m_4)$ The outputs of the phase shifter 30 serve as a mask. This mask is updated further in the control logic using the inputs mask_enable and mask_all, as described in Table 1.

TABLE 1

| | | Control signals |
|---|---|---|
| mask_all | mask_enable | |
| 0 | 0 | No scan chain output is masked |
| 0 | 1 | Masking of scan chain outputs is controlled by the LFSR and phase shifter |
| 1 | 0 | All scan chain outputs are masked |
| 1 | 1 | All scan chain outputs are masked |

Assume that the IC test responses as observed at the outputs of the scan chains SC1-SC4 in the above six clock cycles, are as follows:

$R_1 = (\underline{U}, \underline{U}, \underline{U}, \underline{U})$
$R_2 = (L, L, H, L)$
$R_3 = (H, \underline{U}, L, H)$
$R_4 = (\underline{U}, H, H, L)$
$R_5 = (H, L, L, H)$
$R_6 = (L, H, \underline{H}, L)$ $R_4$ states that in clock cycle four, the output of scan chain 1 SC1 is 'U', the output of scan chains 2 and 3 SC2-SC3 is 'H', and the output of scan chain 4 SC4 is 'L'.

The underlined test responses are the ones that should be masked. This is the case for the unknown responses 'U' in $R_1$, $R_3$, and $R_4$, and for the unreliable response 'H' in scan chain 3 SC3 in $R_6$.

The bold responses indicate 'essential responses' on which a fault effect can be observed by the ATE. The responses $R_1$-$R_6$ are responses of the fault-free circuit-under-test 14 when a certain test pattern is applied. The test pattern can detect the presence of certain faults in the CUT 14. When such a fault is present in the CUT 14, then one or more of the essential responses will show a different value, and hence the fault is detected. The essential responses should not be masked by the XML 18.

The remaining responses, which are neither underlined nor bold, are responses that are either logic low 'L' or logic high 'H'. These are non-essential responses, and no fault effect is observed on these responses for those faults that are targeted by the test pattern. It may however be the case that other faults, which are not targeted by the current test pattern, do result in fault effects that can be observed on these responses. These faults are however detected by other patterns. Hence, the non-essential responses may be masked without affecting the fault coverage. It nevertheless is preferred not to mask these responses, since multiple detections of faults will lead to better defect coverage.

All responses in $R_1$ should be masked. This is achieved by setting control signal mask_all to logic 1 in clock cycle 1. In clock cycles 2 to 6, mask_all is set to logic 0.

No responses have to be masked in $R_2$ and $R_5$, and hence control signal mask_enable is set to logic 0 in clock cycle 2 and 5. In the remaining clock cycles, masking is required and mask_enable is set to logic 1.

In the remaining test responses $R_3$, $R_4$, and $R_6$, the following masking is required:
- $R_{3,2}$, i.e. the output of scan chain 2 in vector $R_3$, is unknown 'U' and should be masked;
- Fault effects can be observed on $R_{3,3}$, $R_{4,3}$, and $R_{6,2}$, and hence these essential test responses should not be masked;
- $R_{4,1}$ is also unknown 'U' and should be masked; and
- $R_{6,3}$ is an unreliable response and should be masked.

These conditions can be used in combination with the symbolic expressions for the mask, as given by the output of the phase shifter 30. The result is the following system of linear equations:

$R_{3,2}$: $x_2 \oplus x_4 \oplus m_1 = 1$ $R_{3,3}$: $x_1 \oplus m_2 = 0$ $R_{4,1}$: $x_1 \oplus x_2 \oplus m_1 \oplus m_2 = 1$ $R_{4,3}$: $x_3 \oplus x_4 \oplus m_3 = 0$ $R_{6,2}$: $x_1 \oplus x_2 \oplus x_3 \oplus m_1 \oplus m_2 \oplus m_4 = 0$ $R_{6,3}$: $x_1 \oplus x_2 \oplus m_1 \oplus m_2 \oplus m_5 = 1$ Such a system of linear equations can easily be solved by using Gauss elimination for example. A possible solution is: $x_1=1$, $x_2=0$, $x_3=1$, $x_4=0$, $m_1=1$, $m_2=1$, $m_3=1$, $m_4=0$, and $m_5=0$.

Substituting this solution into the symbolic equations at the output of the phase shifter 30, and considering the values of the control signals mask_enable and mask_all, results in the following masks:

mask$_1$=(1, 1, 1, 1)
mask$_2$=(0, 0, 0, 0)
mask$_3$=(0, 1, 0, 1)
mask$_4$=(1, 1, 0, 0)
mask$_5$=(0, 0, 0, 0)
mask$_6$=(0, 0, 1, 0)

The test responses after masking, at the input of the compactor 22, are now as follows (the symbol 'm' denotes a test response that is masked):

$R_1'$=(m, m, m, m) ⇒(1, 1, 1, 1) is the input at the compactor
$R_2'$=(L, L, H, L) ⇒(0, 0, 1, 0)
$R_3'$=(H, mL, m) ⇒(1, 1, 0, 1)
$R_4'$=(m, m, H. L) ⇒(1, 1, 1, 0)
$R_5'$=(H, L, L, H) ⇒(1, 0, 0, 1)
$R_6'$=(L, H, m, L) ⇒(0, 1, 1, 0)

The following can be seen:
- all responses that should be masked, i.e. the underlined responses, are indeed masked;
- all essential responses that should not be masked, i.e. the bold responses, are indeed not masked; and
- some non-essential responses that might be masked, are masked, these are indicated by the symbol 'm' that is not underlined.

The above example illustrates one way of computing the values for the XML 18 control signals. This process can easily be included into an Automated Test Pattern Generation (ATPG) tool.

Figure 3:
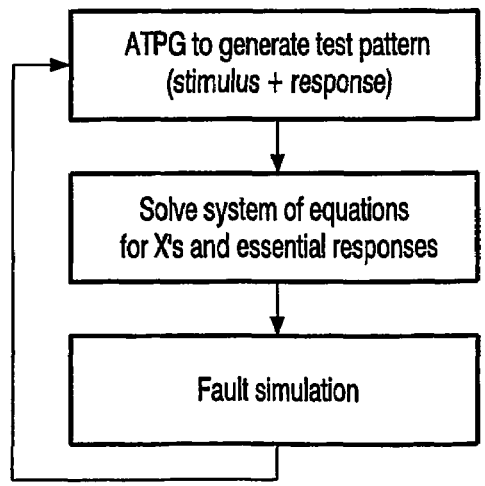
FIG. 3 illustrates an example of an ATPG flow for computing XML control signals.

FIG. 3 illustrates an example of an ATPG flow for computing the XML 18 control signals.

The ATPG tool generates a test pattern that detects certain faults, i.e. target faults. The test pattern comprises the test stimuli and the corresponding test responses. The ATPG tool next analyses the test responses, to identify all tri-state, unknown, and unreliable responses that should be masked, as well as to identify the essential responses that should not be masked. Essential responses are those responses that should be observed in order to detect the target faults.

The values for the mask_all and mask_enable signals are determined by identifying response vectors in which either all or none of the responses should be masked.

The system of linear equations, derived from symbolic simulation of the XML 18 operation, can next be solved to determine the control inputs for the LFSR 26 in the XML 18. The system contains equations for all X responses that should be masked, and at least one essential response that should not be masked. If the equation system is solvable, then additional essential responses, which show the fault effects of additional target faults, may be added to the equation system, and the equation system is solved again. This is repeated until all essential responses are added to the equation system or until the equation system is not solvable anymore. The order of adding the essential responses to the equation system may be determined by the number of faults that can be detected by each essential response. First, the essential responses that detect most faults are added to the equation system, etc.

The final step is to carry out fault simulation, using the test responses after masking, in order to determine which faults are actually detected. This step is required, since some essential responses may have been masked in case the equation system could not be solved. The target faults that are not detected are targeted by the ATPG again when generating subsequent patterns.

FIG. 3 illustrates how the XML 18 control signals can be computed per test pattern. An alternative implementation is to compute the control signals by solving the system of linear equations for only part of a test pattern, or for multiple test patterns.

The chance that the system of equations can be solved is larger if the number of equations is small. Hence, the number of test responses that should be masked and that should not be masked, should, preferably, be kept as low as possible. For this reason, it is beneficial to have mask_all and mask_enable control signals, since these allow to mask or not mask complete response vectors, and the corresponding equations do not have to be solved. Similarly, it is also beneficial to not consider the non-essential responses on which no target fault effect can be observed. These non-essential responses may be added to the equation system later, after all essential responses have been added, as long as the system of equations is still solvable.

The proposed XML 18 as described in this invention, provides an effective, flexible, and cheap solution for masking of X responses. The XML 18 allows for reducing the amount of masking data, which is generated during ATPG, that has to be stored on the ATE, and additionally reduces the bandwidth requirements for transporting the mask data from the ATE to the IC 10.

The XML 18 can generate a large number of different masks, which are controlled from the ATE. The masks, and the corresponding control signals to control the XML 18, can be computed during ATPG. The XML 18 is based on dynamic LFSR 26 reseeding, in which the LFSR 26 state is partially updated from the ATE in each clock cycle. This provides a way to compress the XML 18 control data. For a circuit-under test 14 with n scan chains, only q control bits are needed per clock cycle for reseeding the LFSR 26, where q<n. The LFSR 26, plus the optional phase shifter with weighting logic 30, expand the q inputs to an n-bit mask. The additional control logic allows to easily mask all scan chains, or to prevent masking per clock cycle.

The XML 18 hardware is simple, and requires very little silicon area when implemented on an IC 10. The XML 18 may also be implemented partly on-chip and partly off-chip. The number of control signals to control the LFSR 26 state, the size of the LFSR 26, the size of the phase shifter and weighting logic 30, as well as the number of control signals related to mask_all and mask_enable, can be configured differently per design, depending on the profile of the expected X responses.

It should be noted that the above-mentioned embodiment illustrates rather than limits the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. The invention may be implemented by means of hardware comprising several distinct elements, and by means of a suitably programmed computer. In a claim enumerating several means, several of these means may be embodied by one and the same item of hardware. The mere fact that certain measures are recited in mutually different dependent claims does not indicate that a combination of these measures cannot be used to advantage.

The invention claimed is:

1. An apparatus for testing an integrated circuit (10), the apparatus comprising:
    a compactor (22) to compress test responses from a circuit-under-test (14) that is part of an integrated circuit 10; and
    masking circuitry (18) coupled between the circuit-under-test and the compactor (22) for masking one or more of the test responses from the circuit-under-test (14), characterized in that the masking circuitry (18) further comprises decompression circuitry (26, 30, 36, 38) for receiving compressed mask data ($m_1$-$m_q$) from the apparatus and providing decompressed mask data to the mask circuitry (40).

2. An apparatus as claimed in claim 1 wherein decompression is performed by a linear-feedback shift register (26).

3. An apparatus as claimed in claim 1 wherein decompression is performed by phase shifter (30).

4. An apparatus as claimed in claim 1 wherein decompression is performed by weighting logic.

5. An apparatus as claimed in claim 1 wherein, the compressed mask data comprises at least one control signal for controlling the masking circuitry (18).

6. An apparatus as claimed in claim 5 wherein, the at least one control signal is a mask all control signal.

7. An apparatus as claimed in claim 5 wherein, the at least one control signal is a mask enable control signal.

8. A method used in the testing of an integrated circuit (10), characterized by comprising the steps of:
    providing compressed mask data to decompression circuitry;
    decompressing the compressed mask data to produce decompressed mask data; and
    masking test responses from the integrated circuit (10) in response to the decompressed mask data.

9. A method for computing compressed mask data for use in masking test data from an integrated circuit (10), characterized in that it comprises the steps of:
    generating a set of equations associated with the mask data; and
    solving the equations to obtain compressed mask data.

* * * * *